United States Patent [19]
Chan et al.

[11] Patent Number: 5,189,322
[45] Date of Patent: Feb. 23, 1993

[54] LOW-POWER SENSE AMPLIFIER WITH FEEDBACK

[75] Inventors: Melvin D. Chan, Campbell; Brad Sharpe-Geisler, San Jose, both of Calif.

[73] Assignee: Advanced Micro Devices, Inc., Sunnyvale, Calif.

[21] Appl. No.: 500,637

[22] Filed: Mar. 28, 1990

[51] Int. Cl.$^5$ .................. H03F 3/45; G01R 19/00; G11C 7/00
[52] U.S. Cl. .................. 307/530; 307/443; 307/475; 307/263; 365/189.01
[58] Field of Search ............ 307/443, 530, 475, 263; 365/203, 189.01, 205, 207, 208, 189.06, 189.07, 189.11

[56] References Cited

U.S. PATENT DOCUMENTS

| | | | |
|---|---|---|---|
| 4,348,601 | 9/1982 | Kitamura | 307/530 |
| 4,598,389 | 7/1986 | Duvvury et al. | 307/530 |
| 4,728,820 | 3/1988 | Lee | 307/443 |
| 4,728,827 | 3/1988 | Woo | 307/443 |
| 4,880,997 | 11/1989 | Steele | 307/443 |
| 4,972,102 | 11/1990 | Reis et al. | 307/530 |
| 4,982,363 | 1/1991 | Sood | 307/530 |

*Primary Examiner*—Timothy P. Callahan
*Attorney, Agent, or Firm*—Skjerven, Morrill, MacPherson, Franklin & Friel

[57] ABSTRACT

A sense amplifier is provided for sensing an impedance between two lines. The impedance has two levels. The two lines are, in one embodiment, a product term line and a product term ground line of a programmable logic device. In the amplifier, a pull-up circuit connects one of the two lines to a high voltage (for example, $V_{DD}=5$ volts), and a pull-down circuit connects the other line to a low voltage (for example, ground). A negative feedback circuit controls the pull-up and pull-down circuits in response to the voltage on one of the two lines so that the impedance of the pull-up circuit changes in direct relationship with respect to the voltage of that line, and the impedance of the pull-down circuit changes in an inverse relationship with respect to that voltage. The feedback circuit has a delay at least as long as the transition of that voltage between its two values, which values correspond to the two impedance levels. The delay permits to increase the transition speed in a power-efficient manner. The delay can be implemented by simple circuitry. The pull-down circuit includes, in some embodiments, two electrical paths structured so as to make the amplifier more tolerant to temperature and process variations.

27 Claims, 12 Drawing Sheets

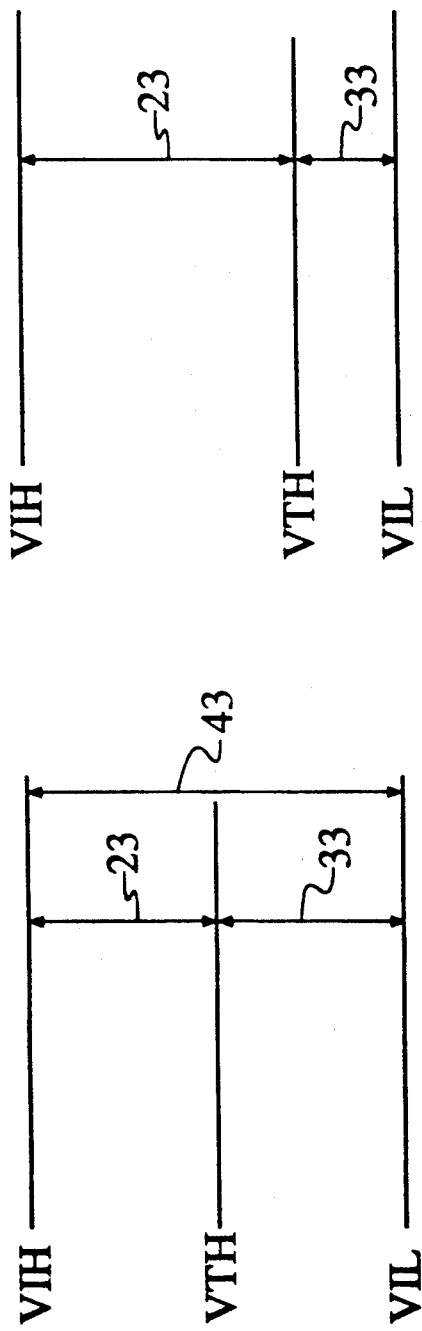

LOW-POWER SENSE AMPLIFIER WITH FEEDBACK

BACKGROUND OF THE INVENTION

1. Field of the Invention

This invention relates to electronic devices, and more particularly to sense amplifiers.

2. Field of Related Art

Sense amplifiers are widely used to amplify output signals of memory circuits. FIG. 1 shows a diagram of a typical device using a sense amplifier 8. Circuit 16 may be a memory cell, a combination of memory cells whose outputs are ANDed (say, a PLD), or some other device which has a product term ("PT") output 12 and a product term ground ("PG38")output 14. PT 12 can be high, for example 2.2 V, or low, for example 1.6 V. Sense amplifier 8 includes a p-channel pull-up transistor 34 and an n-channel pull-down transistor 36. Pull-up transistor 34 has a source 61 connected to a positive voltage supply VDD and a gate 51 connected to a voltage supply VREFP. Pull-down transistor 36 has a gate 31 connected to a constant voltage supply (not shown). Transistors 34 and 36 are always on. Circuit 16 can act as a switch to connect PT 12 to PTG 14 or to disconnect them from each other. When circuit 16 disconnects PT 12 from PTG 14, PT 12 is kept high by the voltage supply VDD through pull-up transistor 34. When circuit 16 connects PT 12 to PTG 14, PT 12 is driven low by the current through pull-down transistor 36.

PT 12 is amplified by buffer 18 whose output 120 can be high, for example 5 V, or low, for example 0 V.

FIG. 2 shows a prior art device with sense amplifier 8 in greater detail. Circuit 16 is an n-channel transistor which either connects PT 12 to PTG 14 or disconnects them from each other depending on the voltage on its gate 69. PT 12 is connected to buffer 18 through an n-channel pass transistor 66. Buffer 18 includes inverters 5 and 6. Inverter 6 includes a p-channel transistor 58 whose source 11 is connected to a constant positive voltage supply (not shown), and an n-channel transistor 60 whose source is connected to the ground. Buffer 18 also includes an n-channel feedback transistor 62 and a p-channel feedback transistor 64. Drain 21 of feedback transistor 62 is connected to a positive voltage supply (not shown). Feedback transistors 62 and 64 stabilize the voltage at node 19. When the voltage on node 19 goes too high, node 17 connected to the gates of feedback transistors 62 and 64 goes too low. As a result, the current through transistor 62 goes down, and the current through transistor 64 goes up. This pulls the voltage at node 19 down until the voltage at node 19 reaches its normal value. When the voltage at node 19 becomes too low, the voltage at node 17 is pulled up high. As a result, the current through feedback transistor 64 goes down, and the current through feedback transistor 62 goes up. This pulls the voltage at node 19 up to its normal value.

FIG. 3 shows another circuit with a sense amplifier. Buffer 18 includes inverters 3 and 4. Inverter 3 includes a p-channel transistor 44 and an n-channel transistor 46. Inverter 4 includes a p-channel transistor 40 and an n-channel transistor 42. Buffer 18 further includes an n-channel feedback transistor 50 and an n-channel feedback transistor 48.

FIG. 4 shows another device using a sense amplifier. Here circuit 16 includes an EEPROM cell 10 and a transistor 24 whose gate is connected to a row line. PT 12 is connected to the gate of pull-down transistor 36. PTG 14 is connected through pull-down transistor 36 to the drain of another pull-down transistor 28. The source of transistor 28 is connected to the ground. The gate of transistor 28 is connected to a positive voltage supply (not shown). The gate of clamp transistor 26 is connected to PT 12 through pass transistor 66. Buffer 18 comprises inverters 20 and 22. Inverter 20 comprises a p-channel transistor 39 and an n-channel transistor 38. VREFP is generated by voltage divider 57 of which VDD is an input. As a result, VREFP tracks VDD; when VDD increases, so does VREFP.

FIG. 5 diagrams PT 12 and output 120. When PT 12 rises from the low level VIL of 1.6 V to the high level VIH of 2.2 V as shown in FIG. 5(a), output 120 rises from 0 V to 5.0 V. The steeper is the rising edge 70 of PT 12, the steeper is the rising edge 71 of output 120 and so the faster is the sense amplifier on low-to-high transitions. When PT 12 falls from high to low as shown in FIG. 5(b), output 120 falls also. The steeper is the falling edge 75 of PT 12, the steeper is the falling edge 76 of output 120 and so the faster is the sense amplifier on high-to-low transitions.

It is desirable to provide a faster sense amplifier, and so it is desirable to provide steeper edges 71 and 76. It is also desirable to reduce the power consumption of a sense amplifier.

When the voltage on PT 12 changes between its low value VIL, say, 1.6 V, and its high value VIH, say, 2.2 V, buffer 18 switches output 120 at some intermediate input threshold voltage VTH, say 1.9 V. The relationship between VIL, VIH and VTH is shown in FIG. 6. The difference ("noise margin") 23 between VIH and VTH determines the tolerance of sense amplifier 8 to noise when PT 12 is high. The difference ("noise margin") 33 between VTH and VIL determines the tolerance of sense amplifier 8 to noise when PT 12 is low. As shown in FIG. 6(a), voltage VTH is usually near the middle between VIL and VIH, so that the noise margins 23 and 33 are about equal. At low operating temperatures, say at 0° C., the threshold voltage VTH decreases. See FIG. 6(b). Another factor that can decrease voltage VTH is an increase, even by 5%, in voltage VDD on the source of pull-up transistor 34. When voltage VTH decreases, noise margin 33 between VTH and VIL also decreases. As a result, the sense amplifier becomes less reliable because it becomes more sensitive to noise on PT 12 when PT 12 is low. To keep noise margin 33 wide, sense amplifiers are made so that the total difference ("window") 43 between VIH and VIL is large. This can be achieved, for example, by enlarging the transistors in the sense amplifier. Yet increasing window 43 between voltages VIH and VIL makes the device using the sense amplifier slower, because it takes longer to switch between voltages VIH and VIL which are far apart. It is desirable to provide a sense amplifier fast and reliable both in normal conditions and at low temperatures and high VDD voltage supplies. It is desirable in general to decrease the noise sensitivity in a sense amplifier.

Some sense amplifiers use feedback circuitry to stabilize voltages. Transistors 62 and 64 in FIG. 2 form such a circuit. Yet many feedback circuits have only a limited application because they are intolerant to process variations. Feedback circuits usually include both p-channel and n-channel transistors manufactured during different process steps. The ratio between the p- and n-channels is crucial for the correct operation of the feedback circuit. If, due to process variations, p-channels are too large, many feedback circuits are unreliable. It is desirable to provide a sense amplifier more tolerant to process variations.

Circuit 16 may be a combination of memory cells whose outputs are ANDed together. Circuit 16 of FIG. 7 has EEPROM memory cells like cell 53. Each cell is connected to PT 12 through a transistor like transistor 63. If all memory cells like cell 53 are programmed to conduct, and row line 45 is high, PT 12 is driven very low, possibly below 1.6 V. As a result, the transition of PT 12 from low to high (when row line 45 goes from high to low) is especially slow. A similar problem occurs on high-to-low transitions if only one of the memory cells is programmed to conduct. In that case, when row line 45 changes from low to high, PT 12 is driven from high to low by only one conducting memory cell. This transition is quite slow. It is desirable to provide a sense amplifier which provides fast transitions of output 120 when circuit 16 is a combination of memory cells of FIG. 7.

SUMMARY OF THE INVENTION

This invention provides a fast sense amplifier with low power consumption.

In the sense amplifier of the present invention, low voltage VIL and high voltage VIH track threshold voltage VTH. Thus when VTH decreases, VIL and VIH decrease by about the same amount. As a result, the noise margins do not change significantly, and so the sense amplifier has low noise sensitivity at low temperatures and high VDD voltages even when the window VIH-VIL is small. The sense amplifier is tolerant to process variations. It operates fast when used to amplify the output of a multicell memory.

According to one aspect of the present invention, an apparatus for sensing whether or not a first line and a second line are electrically connected to each other comprises a first electrical path between the first line and a voltage V1 and a second electrical path between the second line and a voltage V2 different from V1. The apparatus further comprises first means for opening and closing the first electrical path in response to a voltage on the first line, and second means for opening and closing the second electrical path in response to the voltage on the first line. The first and second electrical paths and the first and second means cooperate so that the voltage on the first line has a value: V3 when the first and second lines are disconnected from each other; and V4 different from V3 when the first and second lines are connected to each other. The first means opens the first path when the voltage on the first line is V3, and closes the first path when the voltage on the first line is V4. The second means opens the second path when the voltage on the first line is V4, and closes the second path when the voltage on the first line is V3. Each of the first and second means has a delay at least as long as a transition of the voltage on the first line from V3 to V4 and at least as long as a transition of the voltage on the first line from V4 to V3.

According to another aspect to the invention, an apparatus for amplifying a two-value signal on an input line comprises a buffer for amplifying the signal on the input line, first means for providing a current therethrough to the input line, second means for sinking a current therethrough from the input line, and a feedback circuit for controlling impedances of the first and second means in response to a voltage on the input line. The feedback circuit changes the impedance of the first means in a direct relationship with respect to a voltage on the input line. The feedback circuit changes the impedance of the second means in an inverse relationship with respect to said voltage. The feedback circuit has a delay at least as long as a transition of the signal from any one of its two values to the other.

According to another aspect of the invention, an apparatus for accelerating transitions of a two-state signal on an input line, said signal having a first voltage in a first one of the two states and a second voltage higher than the first voltage in a second one of the two states, comprises first means responsive to said signal, for connecting said input line to a first voltage supply when said signal is in said second state. The first means disconnects the input line from the first voltage supply when the signal is in the first state. The first voltage supply supplies a voltage lower than the first voltage. The first means has a delay at least as long as a transition of the signal from the second state to the first state. The apparatus further comprises second means responsive to the signal for connecting a second voltage supply to the input line when the signal is in the first state. The second means disconnects the second voltage supply from the input line when the signal is in the second state. The second voltage supply supplies a voltage higher than the second voltage. The second means has a delay at least as long as a transition of the signal from the first state to the second state.

According to another aspect of the invention, a sense amplifier for sensing an impedance between a first and a second lines of a circuit, said impednace having two levels, comprises a pull-up circuit for passing a current between a first voltage supply and said first line, said first voltage supply supplying a first voltage. The sense amplifier further comprises a pull-down circuit for passing a current between a second voltage supply and the second line, said second voltage supply supplying a second voltage lower than said first voltage. The sense amplifier further comprises means for controlling said pull-up and pull-down circuits in response to changes in the impedance between said first and second lines. The controlling means changes an impedance of the pull-up circuit in a direct relationship with respect to changes of the impedance between said first and second lines. The controlling means changes an impedance of the pull-down circuit in an inverse relationship with respect to changes of said impedance between the first and second lines. The controlling function of said controlling means has a delay which is at least as great as the time of transition of a voltage on said first line, in response to a change in the impedance between said first and second lines, from any one of said two levels to the other.

According to another aspect of the invention, an amplifier for amplifying a signal that has alternatively a first state and a second state, comprises an output terminal; first means for amplifying said signal, said first means having a first output terminal; second means for amplifying said signal, said second means having a second output terminal, said second means reacting faster to transitions of said signal from said first state to said second state than said first means, said second means reacting slower to transitions of sad signal from said second state to said first state than said first means; and third means for electrically connecting said output terminal of said amplifier to: said second output terminal but not to said first output terminal during the transitions of said signal from said first state to said second state; and to said first output terminal but not to said second output terminal during the transitions of said signal from said second state to said first state.

according to another aspect of the invention, an apparatus for sensing whether an electrical signal on a terminal is in a first state or a second state comprises first means for coupling said terminal to a voltage V1 which is higher than a voltage of said signal in said first and second state; second means for coupling said terminal to a voltage V2 which is lower than the voltage of said signal in said first and second states; and a negative feedback circuit responsive to the state of said signal, for controlling said first and second means so that they oppose transitions of said signal from any one of said first and second states to the other, said negative feedback circuit having a delay at least as long as any one of said transitions.

BRIEF DESCRIPTION OF THE DRAWINGS

FIGS. 6(a) and (b) show a relationship between input and threshold voltages of an amplifier at different temperatures and voltage supplies.

DESCRIPTION OF THE PREFERRED EMBODIMENTS

The performance objectives for an amplifier used in a digital circuit (i.e., a sense amplifier) are: minimize propagation delay from input to output; minimize power consumption; maximize noise margin; minimize temperature sensitivity; minimize sensitivity to process variations. Changes improving performance with respect to one objective often degrade performance with respect to another (e.g., a change which reduces propagation delay will generally either increase power consumption or reduce noise margin or both). An optimum design then is one which balances the above performance objectives.

A digital amplifier has two states—high and low—and deals with two types of transitions—high to low and low to high. Prior art amplifiers have a fixed configuration to handle the two types of transitions. One can make changes to improve performance for one type of transition (say, high to low) which then degrades performance of the other (low to high). In the present invention the two types of transitions are treated separately. This is accomplished by altering the configuration of the amplifier to behave optimally for the next transition. For example, when the amplifier is in the high state, the amplifier is configured to be optimal for a high to low transition since the next transition will be high to low. When the transition is complete, the state of the amplifier will have changed and the amplifier will then be configured to perform optimally for the next transition. This approach allows improvement in performance with respect to, say, propagation delay, without having to degrade performance with respect to the other objectives.

Figure 1:
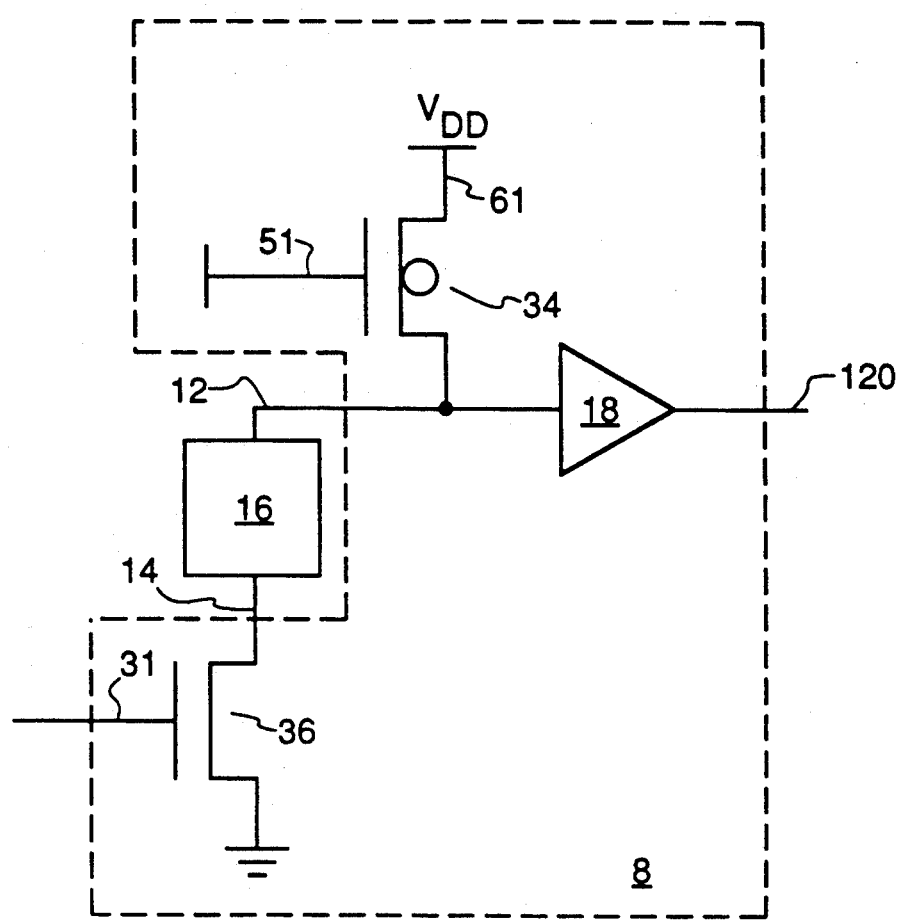
FIGS. 1–4 show diagrams of prior art sense amplifiers.
Figure 2:
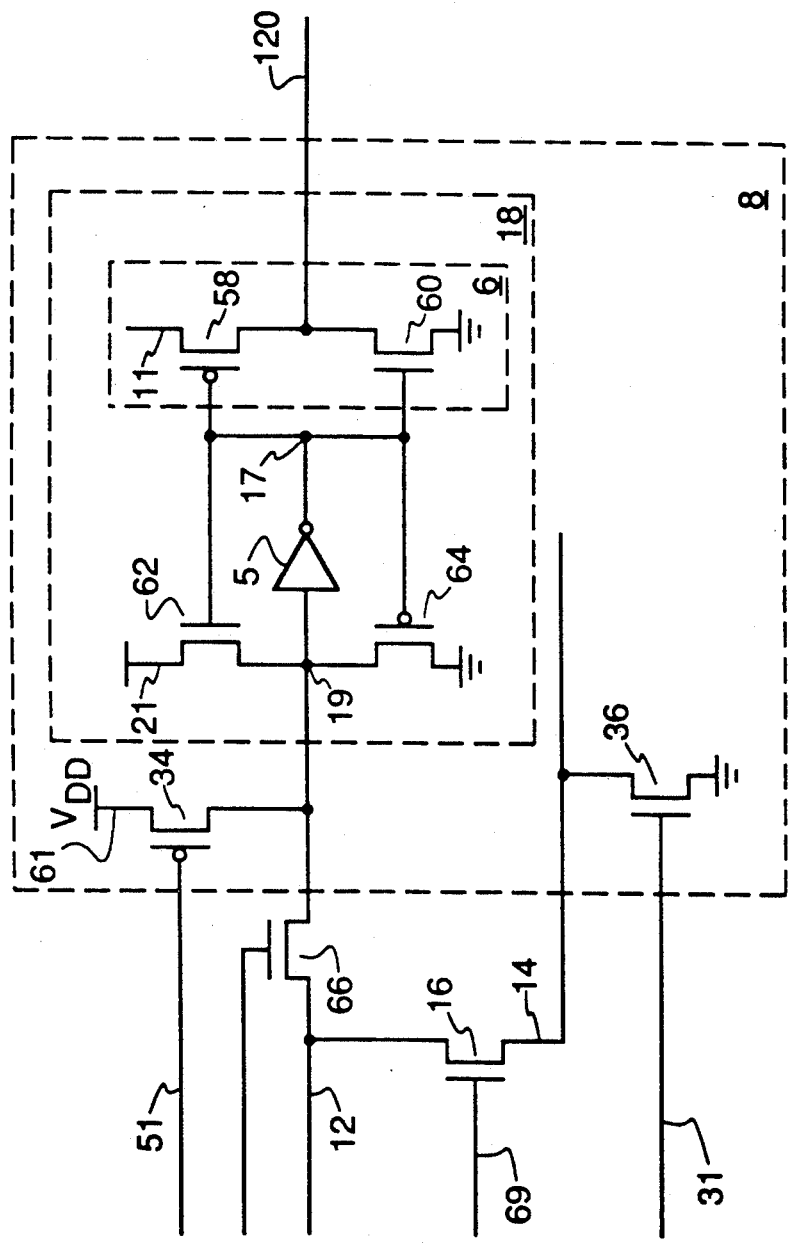
Figure 3:
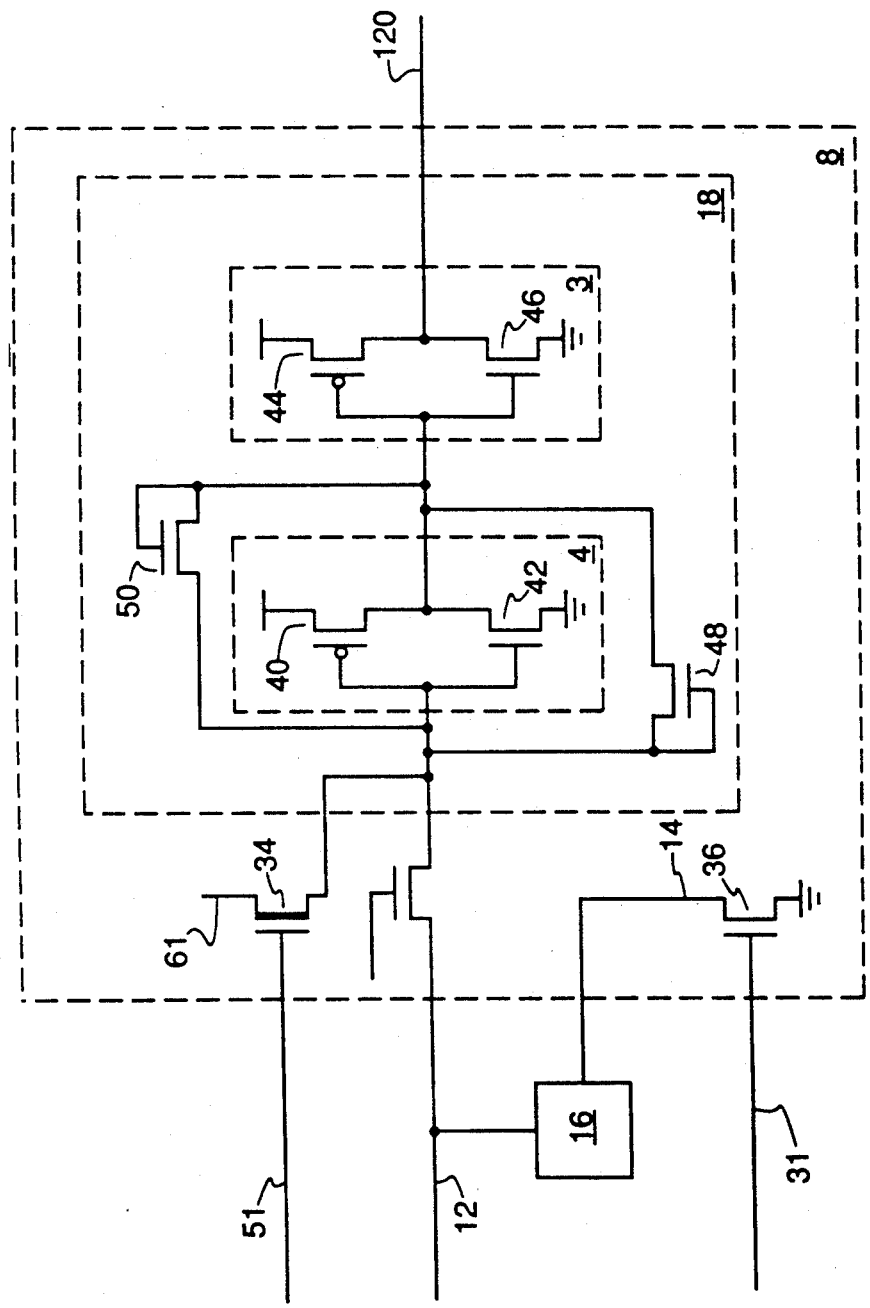
Figure 4:
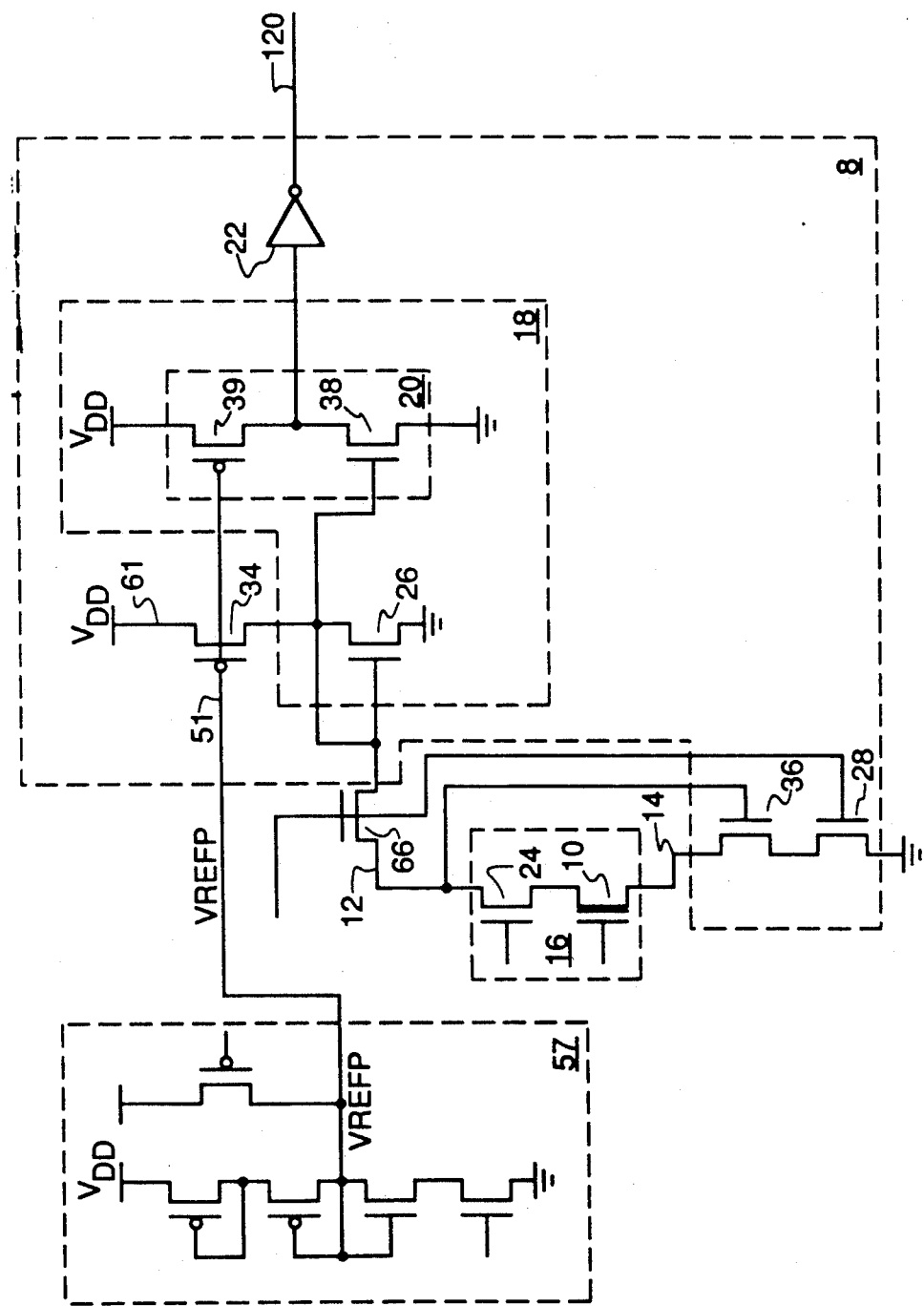
Figure 5B:
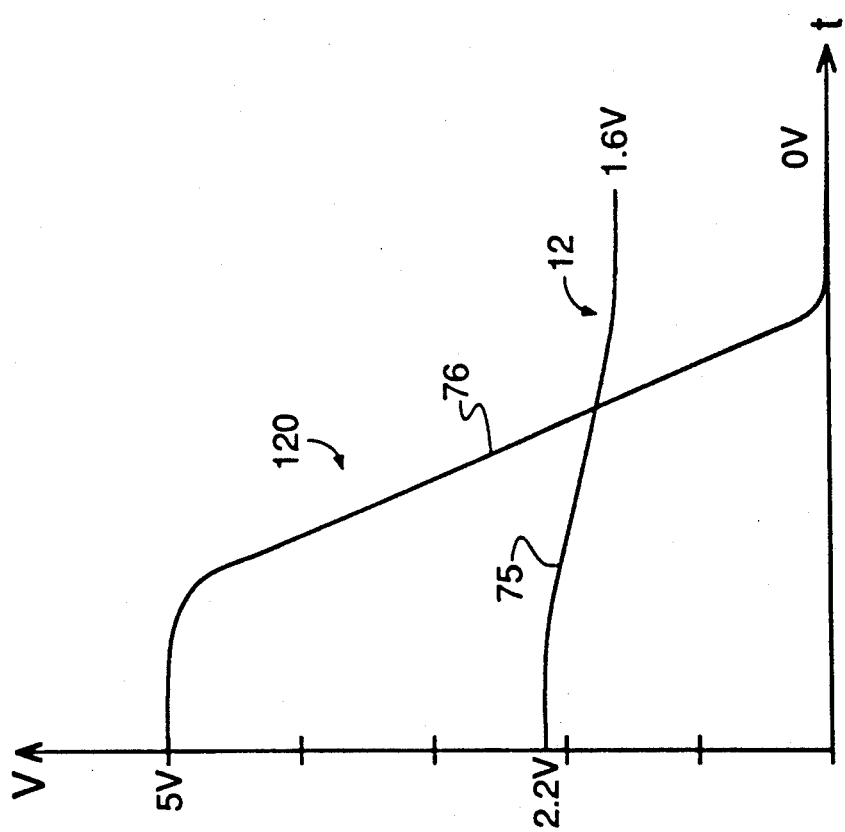
FIGS. 5(a) and (b) diagram a product term PT and an output of prior art sense amplifiers.
Figure 5A:
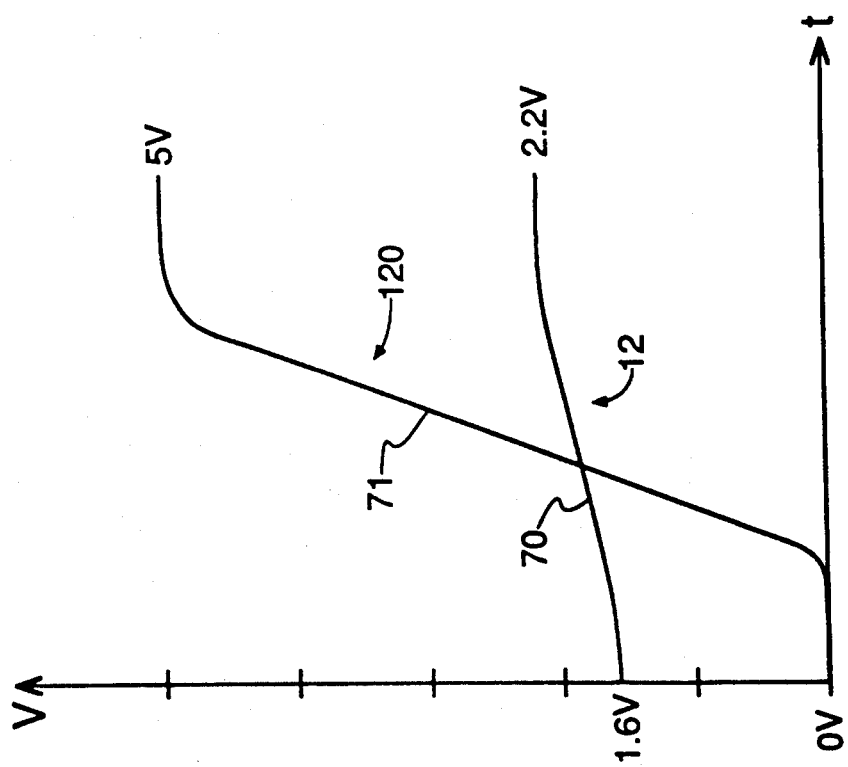
Figure 8:
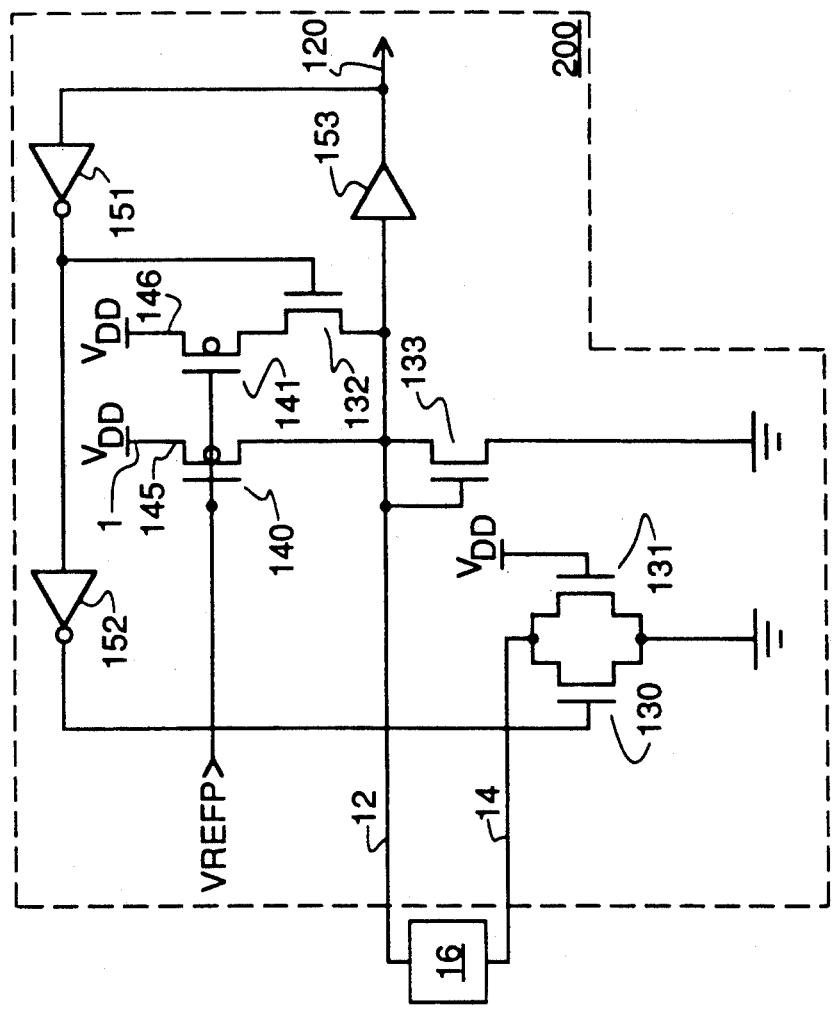
FIG. 8 shows a diagram of a sense amplifier according to the present invention.

FIG. 8 shows a diagram of a sense amplifier 200 according to the present invention. PT signal 12 can be high, for example 2 V, or low, for example 1.6 V. Sense amplifier 200 includes p-channel pull-up transistors 140 and 141 and n-channel pull-down transistors 130 and 132. Sources 145 and 146 of, respectively, pull-up transistors 140 and 141 are connected to a constant positive voltage supply VDD, 5.0 V in one embodiment. Their gates are connected to a constant voltage supply VREFP, 3.0 V in one embodiment. Pull-up transistors 140 and 141 are always on. The drain of pull-up transistor 140 is connected to PT 12. The drain of pull-up transistor 141 is connected to the drain of an n-channel transistor 132 whose source is connected to PT 12. The gate of pull-down transistor 131 is connected to voltage supply VDD. Pull-down transistor 131 is always on. The sources of pull-down transistors 130 and 131 are connected to the ground.

PT 12 is amplified by buffer 153 which provides output 120 of sense amplifier 200. Output 120 can be high, for example, 5.0 V, or low, for example, 0 V. Output 120 is connected to a feedback circuit comprising CMOS inverters 151 and 152, transistor 132 and pull-down transistor 130.

Circuit 16 can connect PT 12 to PTG 14 or disconnect them from each other. When circuit 16 connects PT 12 to PTG 14, PT 12 is driven low by the current through pull-down transistor 131. When circuit 16 disconnects PT 12 from PTG 14, PT 12 is driven high by voltage supply VDD through pull-up transistor 140.

The feedback technique operates as follows. While PT 12 is connected to PTG 14 through circuit 16, PT 12 is low. Output 120 is at 0 V. Transistor 132 is on providing low impedance. Transistor 130 is off providing high impedance. When PT 12 is disconnected from PTG 14, PT 12 is pulled high very rapidly because both pull-up transistors 140 and 141 are on and only transistor 133 pulls any current down to the ground. Output 120 also rises. See FIG. 9(a). The delay of inverter 151 is greater than the rising time of PT 12, so the gate of transistor 132 remains high through the entire transition period of PT 12. As a result, the current through pull-up transistor 141 pulls PT 12 up throughout the transition period. Hence, PT 12 "overshoots", i.e. goes above its high value of 2.0 V (at portion 90) to about 2.2 V. Output 120 goes high, and the output of inverter 151 goes low. The gate of transistor 132 becomes low, the impedance of transistor 132 increases, and no current flows through transistor 141. PT 12 then decreases to 2.0 V at portion 91. Due to the extra pull of PT 12 by VDD through pull-up transistor 141, PT 12 goes up faster and its rising edge 70 is steeper. This, and the overshooting, makes output 120 go up faster and makes rising edge 71 of output 120 steeper. Sense amplifier 200 is about 40% faster than prior art sense amplifiers of FIGS. 1 through 4 operating at the same level of power consumption.

Figure 9B:
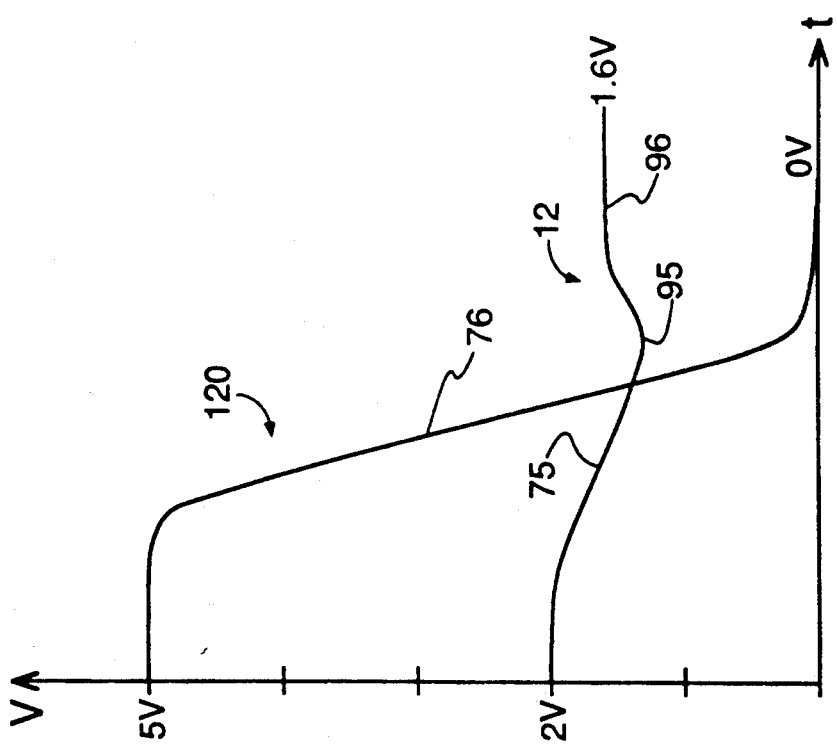
FIGS. 9(a) and (b) diagram a product term PT and an output of a sense amplifier according to this invention.
Figure 9A:
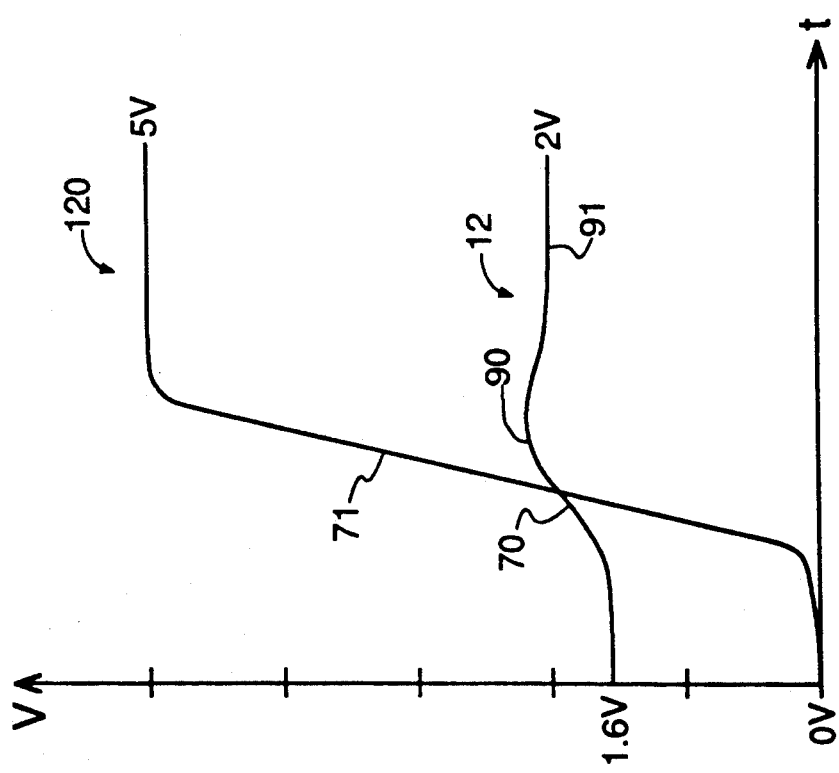

Transitions of output 120 from high to low are also very fast. While PT 12 is disconnected from PTG 14, PT 12 is high. Output 120 is at 5.0 V. Pull-down transistor 130 is on. When circuit 16 connects PT 12 to PTG 14, PT 12 goes down very fast because it is pulled down by current through both transistors 130 and 131. Because of the delay of inverter 151, transistor 130 will remain on during the entire transition of PT 12. PT 12 goes down below its normal low level of 1.6 V providing portion 95, FIG. 9(b). Then pull down transistor 130 gets shut off and PT 12 increases to its nominal low value of 1.6 V (portion 96). FIG. 9(b) also diagrams output 120 during this transition. On these transitions, sense amplifier 200 is also about 40% faster than sense amplifiers of FIGS. 1 through 4 operating at the same level of power consumption.

The transistor sizes can be chosen so that sense amplifier 200 would consume less power and operate at lower speed. If it operates at the speed of sense amplifiers of FIGS. 1-4, then sense amplifier 200 consumes about 50% less power than each of the sense amplifiers of FIGS. 1-4.

Shutting off transistor 132 when PT 12 is high and shutting off transistor 130 when PT 12 is low helps conserve power. It also increases speed. Indeed, if, for example, transistor 132 remained on when PT 12 is high, PT 12 would remain at 2.2 V (portion 90) and would not come down to 2.0 V (portion 91). As a result, at the next transition to the low level, PT 12 would have to go low from a higher voltage of 2.2 V, which would take longer than a transition from 2.0 V of portion 91. Current through transistor 132 would also slow the transition. Thus shutting off transistor 132 at portion 91 makes the high-to-low transitions faster. Similarly, shutting off transistor 130 at portion 96 (when PT 12 is low) makes the low-to-high transitions faster.

Figure 10:
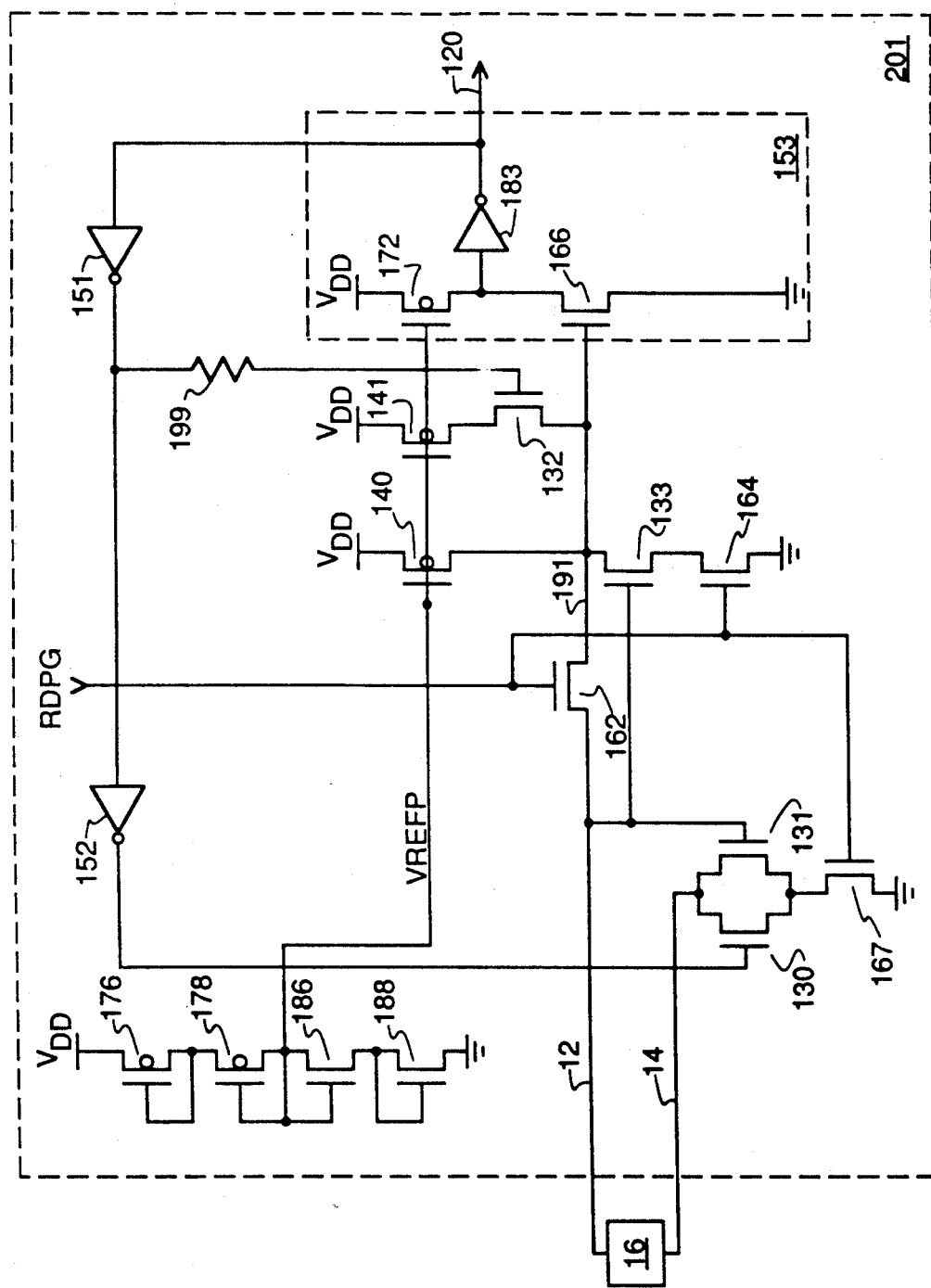
FIG. 10 shows a diagram of another sense amplifier according to this invention.

FIG. 10 shows another sense amplifier according to the present invention. P-channel pull-up transistors 140 and 141 have a channel width to length ratio of 8/1.8. Transistor 132 has a channel width to length ratio of 4/1.8. Thus turning transistor 132 on roughly doubles the current from voltage supply VDD to PT 12. Voltage VDD is about 5.0 V, and voltage VREFP connected to the gates of transistors 140 and 141 is about 3.0 V. PT 12 is connected to buffer 153 through an n-channel pass transistor 162 having a channel width to length ratio of 10/2.3. The gate of transistor 162 is connected to a voltage RDPG of about 9.0 V so that transistor 162 is fully on and affords negligible impedance. If circuit 16 is an EEPROM memory, RDPG is brought to 0 V only when circuit 16 is reprogrammed. Buffer 153 comprises a p-channel transistor 172 having a channel width to length ratio 10.6/1.8, an n-channel transistor 166 having a channel width to length ratio 6/1.8, and a CMOS inverter 183 having a p-channel width to length ratio 8.1/1.3 and an n-channel width to length ratio 8/1.3. This sets the threshold voltage VTH of buffer 153 to approximately 1.8 V. CMOS inverter 151 has a p-channel width to length ratio 3/1.3 and an n-channel width to length ratio of 3/3. Inverter 151 has a delay of about 3ns. Resistor 199 interconnects the output of inverter 151 and the gate of transistor 132 and provides an additional delay. Resistor 151 is implemented by a long polysilicon lead-in between the output of inverter 151 and the gate of transistor 132. CMOS inverter 152 has a p-channel width to length ratio 4.4/1.3 and an n-channel width to length ratio 4.2/1.3. Pull-down n-channel transistor 130 has a channel width to length ratio 5.5/1.3. Pull-down n-channel transistor 131 has a channel width to length ratio 10/1.8. N-channel transistor 167 has a channel width to length ratio 20/2.3. Drain 191 of transistor 162 is connected to the ground through n-channel transistors 133 and 164. Transistor 133 has a channel width to length ratio 5/2.3. Transistor 164 has a channel width to length ratio 18.1/2.3. VDD is connected to VREFP through a diode voltage divider comprising p-channel transistors 176 and 178 and n-channel transistors 186 and 188, so VREFP tracks VDD. VDD is rated between 4.75 V and 5.25 V.

Sense amplifier 201 operates similarly to sense amplifier 200. When PT 12 is low, transistor 132 is on ready to provide an additional pull-up current during the transition of PT 12 from low to high. When PT 12 is high, transistor 130 is on ready to provide an additional pull-down current during the transition of PT 12 from high to low. The transition diagrams of PT 12 and output 120 are like those for the sense amplifier 200, so they are shown in FIG. 9.

Other inverters or feedback circuits may be used instead of inverter 151. In any case, it is desirable that the delay through the feedback circuit be larger than the time of transition of PT 12 from low to high and from high to low. If the delay on the low-to-high transition is not large enough, pull-down transistor 130 may turn on too soon and slow down the transition of PT 12 from low to high. Similarly, if the delay on the high-to-low transition is not large enough, transistor 132 may turn on too soon and slow down the transition of PT 12 from high to low. At the same time, if sense amplifier 201 is part of a larger integrated circuit, the delay may have to be smaller than the time of propagation of a transition of PT 12 through the rest of the integrated circuit. In one embodiment with circuit 16 being a memory of FIG. 7, this propagation time is about 7ns, and the 3ns delay is adequate.

When PT 12 is high, transistor 132 is off and thus power consumption is decreased. When PT 12 is low, transistor 130 is off and so the power consumption is decreased. Sense amplifier 201, like sense amplifier 200, provides a 40% increase in speed or a 50% reduction in power consumption compared to the sense amplifiers of FIGS. 1-4.

Sense amplifier 201 is reliable at low operating temperatures and higher VDD voltage. Normally the threshold voltage VTH of buffer 153 is about in the middle between the low voltage VIL and the high voltage VIH of PT 12. See FIG. 6(a). At low temperature or higher VDD, VTH decreases. If low voltage VIL stayed the same, the difference VTH-VIL would decrease, and the sense amplifier would be more sensitive to noise when PT 12 is low. In sense amplifier 201, VREFP tracks VDD, so when VDD increases VREFP increases also. This limits the current through pull-up transistors 140 and 141 and brings VIH and VIL down. As a result, noise margins 23 and 33, FIG. 6(a), do not change significantly. Measurements have shown that the same occurs at low temperatures—VTH, VIL and VIH decrease by about the same amount, so that noise margins 23 and 33 do not change significantly. The reason for this is as follows. Changes in temperature change the balance between the n- and p-channel transistors. That balance determines voltages VIH, VIL and VTH. The balance between p-channel transistors 176, 178 and n-channel transistors 186, 188 of the voltage divider changes in the same way as the balance between p-channel transistors 140, 141, 172 and n-channel transistors 131, 133, and 166 of the rest of the circuit. Consequently, voltage VREFP reflects the changes in the balance. Voltage VREFP is connected to the gates of the p-channel transistors 140, 141 and 172. As a result, voltage VREFP tracks the balance in such a way that the high and low input voltages VIH and VIL track threshold voltage VTH. The balance between the p- and n-channel transistors of some prior art amplifiers was upset by circuit 16. For example, in sense amplifier 8 of FIG. 4, pull-down transistor 36 has to have low impedance to provide a rapid pull-down of PT 12 on high-to-low transitions. As a result, deviations of the impedance of circuit 16 due to temperature and process variations and other factors have a considerable effect on the voltage at PT 12. But the impact of impedance changes of circuit 16 in sense amplifier 201 is insignificant. The reason for this is as follows. Transistor 130 draws a lot of current during the high-to-low transitions. This allows to make transistor 131 fairly small and still provide fast high-to-low transitions. Thus, transistor 131 has a relatively high impedance, which makes the impedance of circuit 16 less significant. Consequently, sense amplifier 201 does not require, for a reliable operation, as large a window 43 between VIH and VIL as sense amplifiers of FIGS. 1–4. Window 43 of sense amplifier 201 is about 0.4 V (VIL=1.6 V, VIH=2.0 V at the normal temperature). Measurements have shown that, with that window size, sense amplifier 201 is reliable even at −55° C. Window 43 of sense amplifiers of FIGS. 1–4 is at least 0.6 V. The smaller size of window 43 makes devices using sense amplifier 201 faster, because it takes less time to switch PT 12 between VIH and VIL when VIH and VIL are closer.

Process variations can also change the balance between the p- and n-channel transistors and, consequently, the relationship between voltages VIH, VIL and VTH. As explained above, sense amplifier 201 has a high tolerance to changes in the balance between the p- and n-channel transistors. Consequently, sense amplifier 201 has a high tolerance to process variations.

Figure 7:
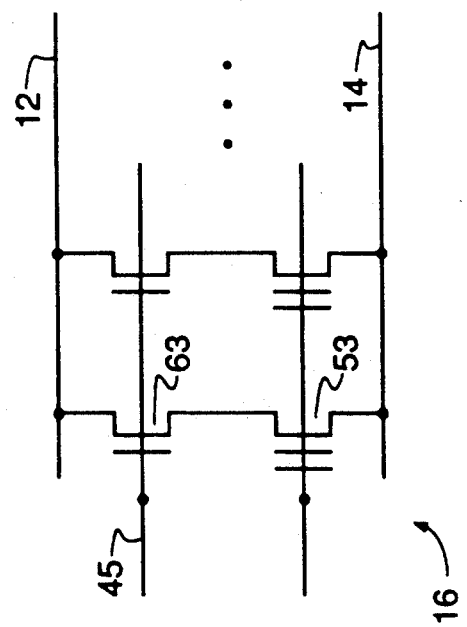
FIG. 7 diagrams a multicell memory whose output goes to a sense amplifier.

Sense amplifiers 200 and 201 provide fast transitions of output 120 when they are used with a multicell memory of FIG. 7 as circuit 16. Even if all memory cells like cell 53 conduct, when row line 45 goes from high to low, PT 12 goes from low to high very fast owing to the extra pull-up voltage through transistors 141 and 132. Even if only one memory cell like cell 53 conducts, when row line 45 goes from low to high, PT 12 goes from high to low very fast owing to the extra pull-down voltage through transistor 130.

Transistors 131 and 133 stabilize the voltage of the input of buffer 153 and, therefore, of output 120. If PT 12 goes too high, more current flows through transistor 133, which brings the input of buffer 153 down. If PT 12 goes too low, less current flows through transistors 131 and 133, which pulls the input of buffer 153 up.

Figure 11:
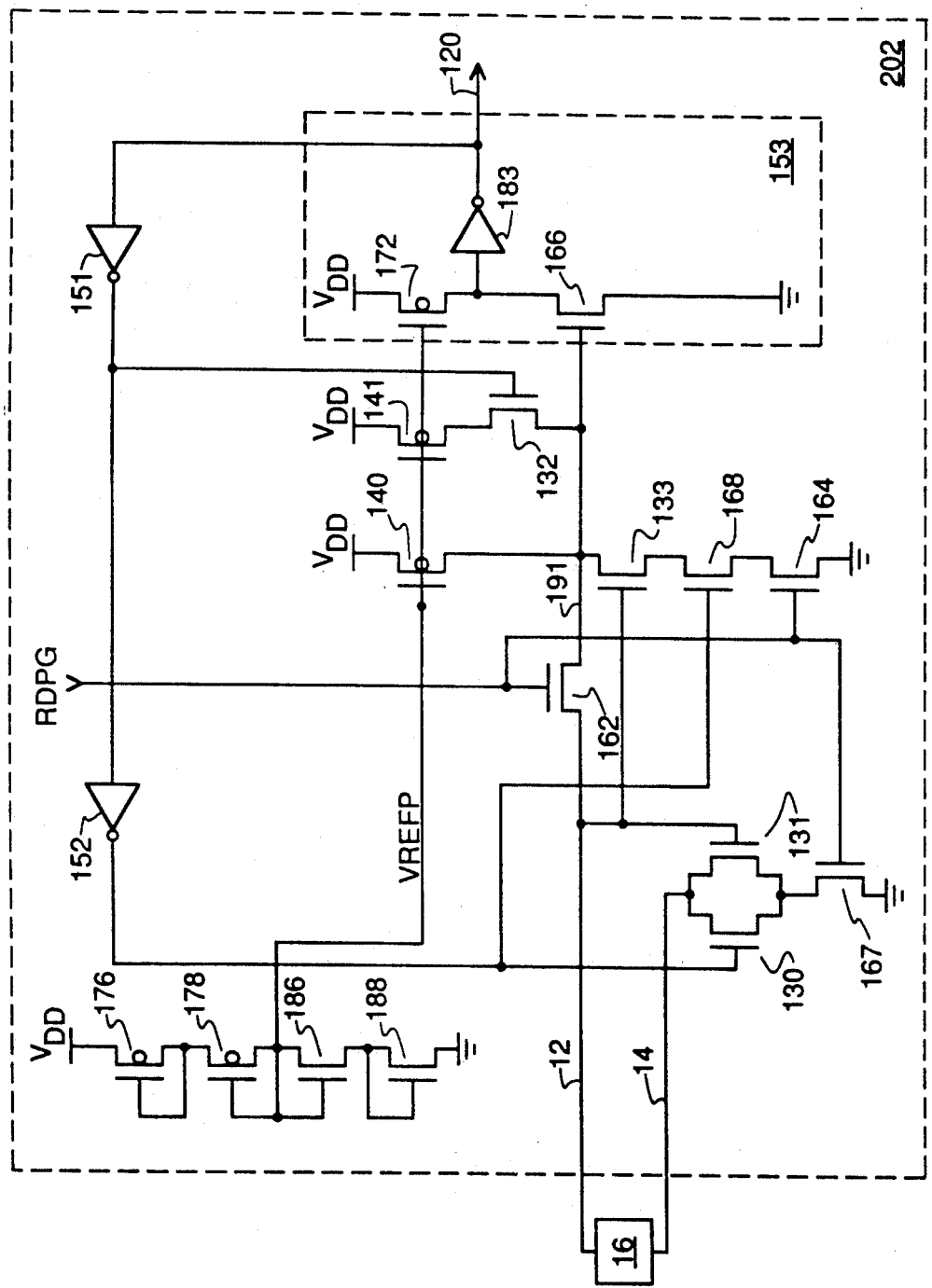
FIG. 11 diagrams another sense amplifier according to the present invention.

FIG. 11 shows another sense amplifier 202 according to the present invention. Sense amplifier 202 is similar to sense amplifier 201. Unlike sense amplifier 201, sense amplifier 202 has an n-channel transistor 168 connected between transistors 133 and 164. The gate of transistor 168 is connected to the output of inverter 152. When PT 12 is low, the gate of transistor 168 is also low, so transistor 168 blocks the current through transistors 133 and 164 to the ground. During the transition of PT 12 from low to high, transistor 168 remains off due to the delay of inventors 151 and 152; the current through transistors 133 and 164 remains blocked, which makes PT 12 go from low to high even faster.

Figure 13:
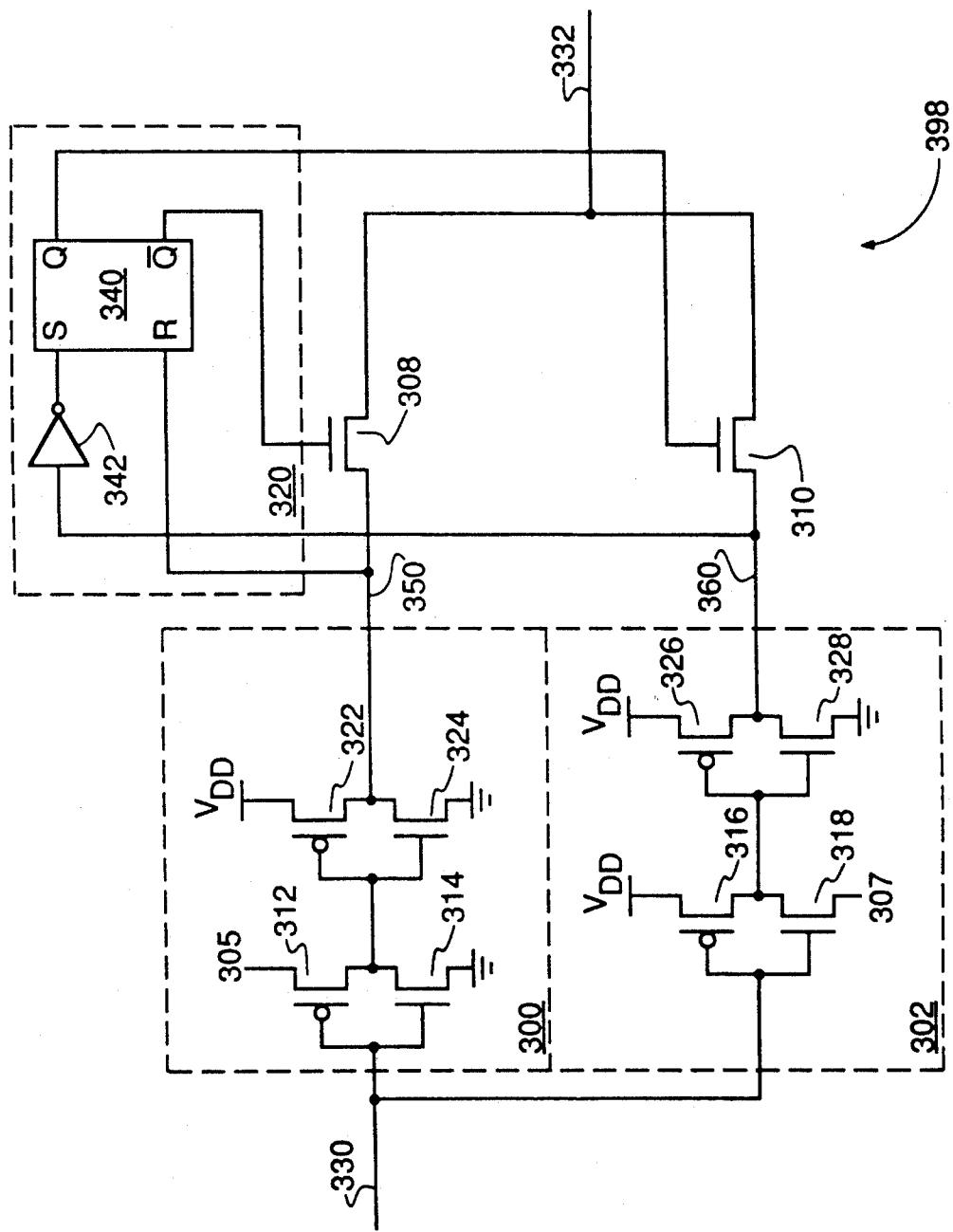
FIG. 13 diagrams another amplifier according to the present invention.

FIG. 13 shows another example of a state-reconfiguring amplifier which would be suitable as a TTL compatible input stage. Amplifier 398 comprises two separate input buffers 300, 302, only one of which is used at any given time, depending on the state of circuit 320. Buffer 300 is optimum for high to low transitions of input 330 whereas buffer 302 is optimum for low to high transitions.

Buffer 300 comprises a CMOS inverter including p-channel transistor 312 and n-channel transistor 314, and another CMOS inverter comprising p-channel transistor 322 and n-channel transistor 324. Buffer 302 comprises a CMOS inverter having p-channel transistor 316 and n-channel transistor 318, and another CMOS inverter having p-channel transistor 326 and n-channel transistor 328. Output 350 of buffer 300 is connected to the R input of RS flip-flop 340. Output 360 of buffer 302 is connected to the S input of flip-flop 340 through inverter 342. Output 350 of buffer 300 is also connected to output 332 of amplifier 398 through n-channel pass transistor 308. The gate of pass transistor 308 is connected to the $\overline{Q}$ output of flip-flop 340. Output 360 of buffer 302 is connected to output 332 of amplifier 398 through n-channel pass transistor 310. The gate of pass transistor 310 is connected to the Q output of flip-flop 340.

When input 330 is low, respective outputs 350 and 360 of buffers 300 and 302 are low. The output of inverter 342 is high, and flip-flop 340 is set. Its Q output is high, $\overline{Q}$ is low. So pass transistor 310 is on, and pass transistor 308 is off. Consequently, output 332 is connected to output 360 of buffer 302 but not to output 350 of buffer 300. When input 330 is high, so are respective outputs 350 and 360 of buffers 300 and 302. The R input of flip-flop 340 is high, the S input is low. Flip-flop 340 is then reset. This makes transistor 308 on and transistor 310 off. So output 332 is connected to output 350 of buffer 300 but not to output 360 of buffer 302.

The source of transistor 322 is connected to voltage source VDD, 5.0 V in one embodiment. The source of transistor 312 is connected to voltage source 305 which is less than VDD and higher than ground. Voltage source 305 is about 3.0 V in one embodiment. Thus the threshold voltage of buffer 300 is fairly low (below 3.0 V). In general, adjusting the voltage at source 305 allows one to set the threshold voltage of buffer 300 to a desired value whatever the sizes of transistors 312, 314. The noise margin can therefore be adjusted to a desired value whatever the transistor sizes. Transistors 312 and 324 are much larger than transistors 314, 322. As a result, the transitions from high to low are very fast. Yet transitions from low to high are slow.

Buffer 302 is "symmetric" to buffer 300 so that it provides fast transitions from low to high at the expense of slow transitions from high to low. Voltage source 307 is greater than ground but lower than voltage source 305. Voltage source 307 is around 0.6 V to 0.8 V in one embodiment. In general, adjusting voltage source 307 allows one to set the threshold voltage of buffer 302 to a desired value whatever the sizes of the transistors of buffer 302. The noise margin can therefore be adjusted to a desired value whatever the transistor sizes. Transistors 318 and 326 are much larger than transistors 316 and 328. As a result, transitions from low to high are very fast. Yet transitions from high to low are slow.

As explained above, when input 330 is high, flip-flop 340 is reset. Transistor 308 is on, transistor 310 is off, and output 350 of buffer 300 is connected to output 332 of amplifier 398 while output 360 of buffer 302 is not connected to output 332 of amplifier 398. Transistor 308 will remain on nd transistor 310 off until flip-flop 320 changes state, i.e. until flip-flop 320 gets set. Flip-flop 320 will be set only when output 360 of buffer 302 becomes low, that is after a high-to-low transition. Thus during the high-to-low transition, transistor 308 will remain on and transistor 310 will remain off, so the transition of output 332 will be provided by buffer 300. As explained above, buffer 300 provides fast high-to-low transitions. Thus amplifier 398 provides fast high-to-low transitions. High-to-low transitions of output 360 are slower than high-to-low transitions of output 350. Slower high-to-low transitions of output 360 provide a time delay for the reconfiguration of amplifier 398.

Once output 330 is low, amplifier 398 is "reconfigured". That is, amplifier 398 is driven by buffer 302, while output 350 of buffer 300 is disconnected from output 332 of amplifier 398. Buffer 302 provides fast low-to-high transitions. Buffer 302 will continue to drive output 332 until flip-flop 340 gets reset, that is until outputs 350 and 360 become high. (Output 360, however, will become high earlier than output 350, because buffer 302 provides faster low-to-high transitions than buffer 300. Slow low-to-high transitions of output 350 provide a time delay for the reconfirmation of amplifier 398.) Thus buffer 302 drives output 332 during low-to-high transitions. Since buffer 302 provides fast low-to-high transitions, so does amplifier 398.

The function of circuit 320 can be realized by different implementations.

Figure 12:
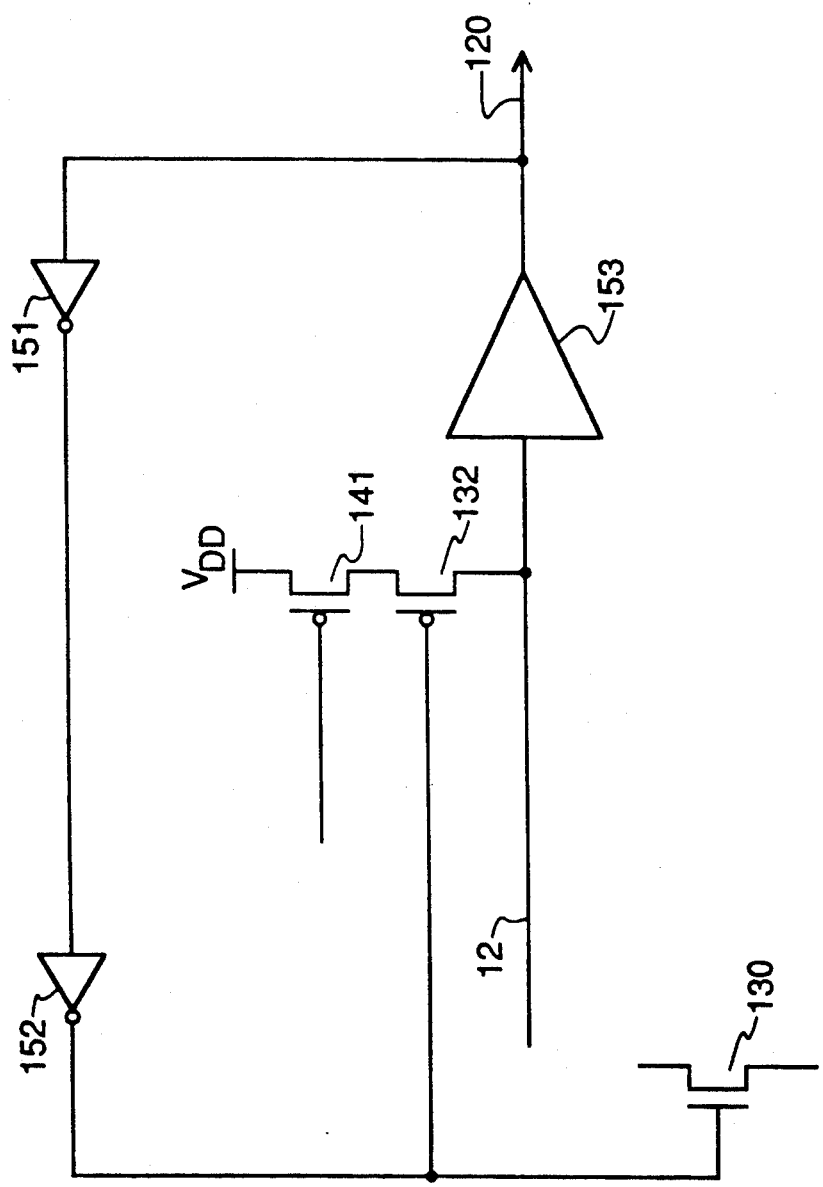
FIG. 12 diagrams part of another sense amplifier according to the present invention.

Other amplifiers may be constructed within the scope of the present invention. Transistor and inverter channel sizes and ratios may vary significantly. Transistor 132 can be a p-channel transistor with its gate connected to the output of inverter 152 rather than of inverter 151. See FIG. 12. Transistor 168 of sense amplifier 202 may be connected above transistor 133 or below transistor 164. The gate of transistor 133 of sense amplifier 201 may be connected to the output of inverter 152. Transistor 162 and voltage source RDPG may be omitted. Bipolar devices can be used instead of MOS devices. Other technologies can also be used. Delayed feedback can be provided by other means than by using inverters 151 and 152. The feedback circuitry can receive input not from output 120, but from PT 12 or from points between PT 12 and output 120. Many other modifications will be obvious to persons reasonably skilled in the art and will not depart from the scope of the present invention.

What is claimed is:

1. An apparatus for sensing whether or not a first line and a second line are electrically connected to each other, comprising:
   a first electrical path between said first line and a voltage V1;
   a second electrical path between said second line and a voltage V2 different from V1;
   first means for opening and closing said first electrical path in response to a voltage on said first line;
   second means for opening and closing said second electrical path in response to the voltage on said first line;
   wherein said fist and second electrical paths and said first and second means cooperate so that the voltage on sad first line has a value:
   V3 when said first and second lines are disconnected from each other; and
   V4 different from V3 when said first and second lines are connected to each other;
   wherein said first means:
   opens said first path when the voltage on said first line is V3; and
   closes said first path when the voltage on said firs line is V4;
   wherein said second means:
   opens said second path when the voltage on said first line is V4; and
   closes said second path when the voltage on said first line is V3; and
   wherein each of said first and second means has a delay at least as long as a transition of the voltage on said first line from V3 to V4 and at least as long as a transition of the voltage on said first lien from V4 to V3.

2. The apparatus of claim 1 further comprising:
   a first p-channel transistor having a source, a drain connected to said first line, and having a gate;
   means for connecting said source to said voltage V1; and
   means for connecting said gate to a voltage supply supplying a voltage lower than said voltage V1;
   wherein said first path comprises:
   a second p-channel transistor having a source, a drain and a gate;
   means for connecting the source of said second p-channel transistor to said voltage V1;
   means for connecting the gate of said second p-channel transistor to said voltage supply; and
   a first n-channel transistor having a drain connected to the drain of said second p-channel transistor and a source connected to said first line; and
   wherein said first means comprises:
   a buffer for amplifying the voltage on said first line; and
   a first CMOS inverter for inverting a signal on an output of said buffer, an output of said first inverter being connected to a gate of said first n-channel transistor.

3. The apparatus of claim 2, wherein said buffer comprises:
   a third p-channel transistor having a source, a drain and a gate;
   means for connecting the source of said third p-channel transistor to said voltage V1;
   means for connecting the gate of said third p-channel transistor to said voltage supply;
   a second n-channel transistor having a drain connected to the drain of said third p-channel transistor, a gate connected to said first line, and having a source;
   means for connecting the source of said second n-channel transistor to said voltage V2; and
   a second CMOS inverter having an input connected to the drain of said third p-channel transistor and having an output connected to the output of said buffer.

4. The apparatus of claim 3, wherein:
   said first inverter has a p-channel width to length ratio of about 3/1.3 and an n-channel width to length ratio of about 3/3, and a delay of about 3 ns;
   said second inverter has a p-channel width to length ratio of about 8.1/1.3 and an n-channel width to length ratio of about 8/1.3;
   each of said first and second p-channel transistors has a channel width to length ratio of about 8/1.8;
   said first n-channel transistor has a channel width to length ratio of about 4/1.8;

said third p-channel transistor has a channel width to length ratio of about 10.6/1.8;
said second n-channel transistor has a channel width to length ratio of about 6/1.8.

5. The apparatus of claim 2, further comprising:
a third p-channel transistor having a source, said third p-channel transistor having a gate and a drain connected to each other;
means for connecting the source of said third p-channel transistor to said voltage V1;
a fourth p-channel transistor having a source connected to the drain of said third p-channel transistor, said fourth p-channel transistor having a gate and a drain connected to each other and to the gate of said first p-channel transistor;
a second n-channel transistor having a source, a gate and a drain, the gate and the drain of said second n-channel transistor being connected to the drain of said fourth p-channel transistor;
a third n-channel transistor having a drain and a gate connected to each other and to the source of said second p-channel transistor, said third n-channel transistor having a source; and
means for connecting the source of said third n-channel transistor to a voltage supply.

6. The apparatus of claim 1 wherein:
said voltages V1 and V2 are constant voltages;
V1 is higher than V3, V3 is higher than V4, and V4 is higher than V2.

7. The apparatus of claim 8 wherein:
said first path comprises:
a first transistor having main current carrying electrodes S1 and D1 and a control electrode G1;
means for connecting said electrode D1 to said voltage V1; and
means for connecting said electrode S1 to said first line;
said first means comprises mean for providing a signal on said control electrode G1 in response to said first line voltage so as to turn on said first transistor when the first line voltage is V4 and to turn off said first transistor when the first line voltage is V3;
said second path comprises:
a second transistor having main current carrying electrodes S2 and D2 and a control electrode G2;
means for connecting said electrode S2 to said voltage V2;
means for connecting said electrode D2 to said second line; and
said second means comprises means for providing a signal on said control electrode G2 in response to said first line voltage so as to turn on said second transistor when the first line voltage is V3 and to turn off said second transistor when the first line voltage is V4.

8. The apparatus of claim 1 further comprising a third, permanently closed electrical path between said second line and said voltage V2.

9. An apparatus for amplifying a two-value signal on an input line, comprising:
a buffer for amplifying said signal on said input line;
first means for providing a current therethrough to said input line;
second means for sinking a current therethrough from said input line; and
a feedback circuit for controlling impedances of said first and second means in response to a voltage on said input line, said feedback circuit changing the impedance of said first means in a direct relationship with respect to a voltage on said input line, said feedback circuit changing the impedance of said second means in an inverse relationship with respect to said voltage, said feedback circuit having a delay at least as long as a transition of said signal from any one of its two values to the other.

10. The amplifier of claim 9, wherein:
said second means comprises a transistor having its source connected to a voltage supply, and its drain connected to said input line; and
said feedback circuit comprises two CMOS inverters connected serially between an output of said buffer and a gate of said transistor.

11. An apparatus for accelerating transitions of a two-state signal on an input line, said signal having a first voltage in a first one of the two states and a second voltage higher than said first voltage in a second one of the two states, said apparatus comprising:
first means responsive to said signal, for connecting said input line to a first voltage supply when said signal is in said second state, said first means disconnecting said input line from said first voltage supply when said signal is in said first state, said first voltage supply supplying a voltage lower than said first voltage, said first means having a delay at least as long as a transition of said signal from said second state to said first state; and
second means responsive to said signal for connecting a second voltage supply to said input line when said signal is in said first state, said second means disconnecting said second voltage supply from said input line when said signal is in said second state, said second voltage supply supplying a voltage higher than said second voltage, said second means having a delay at least as long as a transition of said signal from said first state to said second state.

12. The apparatus of claim 11, wherein said first means comprises:
a transistor;
means for connecting a source of said transistor to said first voltage supply;
means for connecting a drain of said transistor to said input line; and
a delay circuit for controlling a gate of said transistor in response to said signal, a delay of said circuit being at least as long as said transition from said second state to said first state.

13. The apparatus of claim 11 wherein said second means comprises:
a transistor having a source connected to said input line;
means for connecting a drain of said transistor to said second voltage supply; and
a delay circuit for controlling a gate of said transistor in response to said signal, a delay of said delay circuit being at least as long as said transition from said first voltage to said second voltage.

14. A sense amplifier for sensing an impedance between a first and a second lines of a circuit, said impedance having two levels, comprising:
a pull-up circuit for passing a current between a first voltage supply and said first line, said first voltage supply supplying a first voltage.
a pull-down circuit for passing a current between a second voltage supply and said second line, said second voltage supply supplying a second voltage lower than said first voltage; and means for controlling said pull-up and pull-down circuits in response to changes in the impedance between said first and second lines, said controlling means changing an impedance of said pull-up circuit in a direct relationship with respect to changes of said impedance between said first and second lines, said controlling means changing an impedance of said pull-down circuit in an inverse relationship with respect to changes of said impedance between said first and second lines, the controlling function of said controlling means having a delay, said delay being at least as great as the time of transition of a voltage on said first line, in response to a change in said impedance between said first and second lines, from any one of said two levels to the other.

15. The amplifier of claim 14, further comprising:
a buffer for amplifying a voltage on said first line, said voltage having a first value when said impedance is at one of said levels, said voltage having a second value higher than said first value when said impedance is at the other level; and
means for lowering said first and second values in response to a decrease of a threshold voltage of said buffer, said lower means lowering each value by about an amount of said decrease.

16. The amplifier of claim 14, wherein said pull-up circuit comprises:
a first p-channel transistor having a drain connected to said first line;
means for connecting a source of said first p-channel transistor to said first voltage supply;
a second p-channel transistor;
means for connecting a source of said second p-channel transistor to said first voltage supply; and
a first n-channel transistor having a source connected to said first line and a drain connected to a drain of said second p-channel transistor;
wherein said pull-down circuit comprises:
a second n-channel transistor and a third n-channel transistor, each having a drain connected to said second line; and
means for connecting sources of said second and third n-channel transistor to said second voltage supply; and wherein said controlling means comprises:
a first inverter for inverting an output of said amplifier, the delay of said controlling means being about equal to a delay of said first inverter;
means for connecting an output of the first inverter to a gate of said first n-channel transistor; and
a second inverter for inverting the output of the first inverter, an output of the second inverter being connected to a gate of said third n-channel transistor.

17. The amplifier of claim 16 further comprising;
a voltage divider having an input and having an output connected to gates of said first and second p-channel transistors; and
means for connecting the input of said voltage divider to said first voltage supply.

18. An amplifier for amplifying a signal that has alternatively a first state and a second state, said amplifier comprising:
an output terminal;
first means for amplifying said signal, said first means having a first output terminal;
second means for amplifying said signal, said second means having a second output terminal, said second means reacting faster to transitions of said signal from said first state to said second state than said first means, said second means reacting slower to transitions of said signal from said second state to said first state than said first means; and
third means for electrically connecting said output terminal of said amplifier to:
said second output terminal but not to said first output terminal during the transitions of said signal from said first state to said second state; and
said first output terminal but not to said second output terminal during the transitions of said signal from said second state to said first state.

19. The amplifier of claim 18 further comprising an input terminal for receiving said signal, wherein said first means comprises:
a first inverter for inverting said signal, said first inverter having an output, said first inverter comprising:
a first transistor having main current carrying electrodes S1 and D1 and a control electrode G1; and
a second transistor having main current carrying electrodes S2 and D2 and a control electrode G2, wherein said electrode D2 is connected to said electrode D1 and to the output of said first inverter, and said electrode G2 is connected to said input terminal;
a second inverter for inverting the output of said first inverter, said second inverter comprising:
a third transistor having main current carrying electrodes S3 and D3 and a control electrode G3; and
a fourth transistor having main current carrying electrodes S4 and D4 and a control electrode G4, wherein aid electrode D4 is connected to said electrode D3 and to said first output terminal, and said electrode G4 is connected to the output of said first inverter;

20. The amplifier of claim 18 further comprising an input terminal for receiving said signal, wherein said second means comprises:
a first inverter for inverting said signal, said first inverter having an output, said first inverter comprising;
a first p-channel transistor;
means for connecting a source of said first p-channel transistor to a first voltage supply, said first voltage supply supplying a first voltage;
a first n-channel transistor having a drain connected to a drain of said first p-channel transistor, and a gate connected to said input terminal; and
means for connecting a source of said first n-channel transistor to a second voltage supply, said second voltage supply supplying a second voltage below said first voltage;
a second inverter for inverting the output of said first inverter, said second inverter comprising:
a second p-channel transistor;
means for connecting a source of said second p-channel transistor to a third voltage supply, said third voltage supply supplying a third voltage higher than said first voltage;

a second n-channel transistor having a drain connected to a drain of said second p-channel transistor, and a gate connected to the output of said first inverter; and means for connecting a source of said second n-channel transistor to said second voltage supply;

wherein said first p-channel transistor is larger than said first n-channel transistor, and wherein said second n-channel transistor is larger than said second p-channel transistor;

21. The amplifier of claim 18, wherein said third means comprises:

a flip-flop having an input connected to a selected one of said first and second outputs; and a transistor having a gate connected to an output of said flip-flop, a source connected to said selected output, and a drain connected to said output terminal of said amplifier.

22. The amplifier of claim 21, wherein said third means further comprises an inverter having an input connected to said selected output an output of said inverter being connected to the input of said flip-flop.

23. The amplifier of claim 19 wherein each of said first and fourth transistors is larger than each of said second and third transistors.

24. The amplifier of claim 19 further comprising:

means for providing a first voltage to said electrodes S1 and S3;

means for providing a second voltage lower than said first voltage to said electrodes S2; and means for providing a third voltage lower than said second voltage to said electrode S4.

25. The amplifier of claim 19 further comprising:

means for providing a first voltage to said electrode S1;

means for providing a second voltage lower than said first voltage to said electrodes S2 and S4; and means for providing a third voltage higher than said first voltage to said electrode S3.

26. A programmable device comprising:

a first line;

a second line;

a programmable memory cell electrically connecting said first and second lines to each other or electrically disconnecting said first and second lines from each other depending on a state of said memory cell; and an apparatus for sensing whether said first and second lines are electrically connected to each other, said apparatus comprising:

a first electrical path between said first line and a voltage V1;

a second electrical path between said second line and a voltage V2 different from V1;

first means for opening and closing said first electrical path in response to a voltage on said first line;

second means for opening and closing said second electrical path in response to the voltage on said first line;

wherein said first and second electrical paths and said first and second means cooperate so that the voltage on said first line has a value;

V3 when said first and second lines are disconnected from each other; and

V4 different from V3 when said first and second lines are connected to each other; wherein said first means:

open said first path when the voltage on said first line is V3; and closes said first path when the voltage on said first line is V4;

wherein said second means;

opens said second path when the voltage on said first line is V4; and closes said second path when the voltage on said first line is V3; and wherein each of said first and second means has a delay at least as long as a transition of the voltage on said first line from V3 to V4 and at least as long as a transition of the voltage on said first line from V4 to V3.

27. An apparatus for sensing whether an electrical signal on a terminal is in a first state or a second state, comprising:

first means for coupling said terminal to a voltage V1 which is higher than a voltage of said signal in said first and second states;

second means for coupling said remain to a voltage V2 which is lower than the voltage of said signal in said first and second states; and a negative feedback circuit responsive to the state of said signal, for controlling said first and second means so that they oppose transitions of said signal from any one of said first and second states to the other, said negative feedback circuit having a delay at least as long as any one of said transition.

* * * * *

UNITED STATES PATENT AND TRADEMARK OFFICE
CERTIFICATE OF CORRECTION

PATENT NO.   : 5,189,322
DATED        : February 23, 1993
INVENTOR(S)  : Chan et al.

It is certified that error appears in the above-identified patent and that said Letters Patent is hereby corrected as shown below:

Col. 4, line 64, delete "sad" and insert --said--.

Col. 5, line 5, delete "according" and insert --According--.

Col. 11, line 63 (Claim 1), delete "sad" and insert --said--.

Signed and Sealed this

Twenty-fifth Day of January, 1994

Attest:

BRUCE LEHMAN

*Attesting Officer*           *Commissioner of Patents and Trademarks*